United States Patent
Poddar et al.

(10) Patent No.: US 11,302,615 B2
(45) Date of Patent: Apr. 12, 2022

(54) SEMICONDUCTOR PACKAGE WITH ISOLATED HEAT SPREADER

(71) Applicant: TEXAS INSTRUMENTS INCORPORATED, Dallas, TX (US)

(72) Inventors: Anindya Poddar, Sunnyvale, CA (US); Woochan Kim, San Jose, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/840,407

(22) Filed: Apr. 5, 2020

(65) Prior Publication Data

US 2021/0202357 A1    Jul. 1, 2021

Related U.S. Application Data

(60) Provisional application No. 62/955,206, filed on Dec. 30, 2019.

(51) Int. Cl.
*H01L 23/498* (2006.01)
*H01L 23/367* (2006.01)
(Continued)

(52) U.S. Cl.
CPC .... *H01L 23/49811* (2013.01); *H01L 21/4853* (2013.01); *H01L 21/4882* (2013.01);
(Continued)

(58) Field of Classification Search
CPC ............................. H01L 25/0655; H01L 23/36
See application file for complete search history.

(56) References Cited

U.S. PATENT DOCUMENTS 5,403,784 A    4/1995 Hashemi et al.
5,569,625 A    10/1996 Yoneda et al.
(Continued)

FOREIGN PATENT DOCUMENTS

EP    1376747 A2    1/2004

OTHER PUBLICATIONS

LMG341xR070 600-V 70-mΩ GaN with Integrated Driver and Protection, Texas Instruments Incorporated, Dallas, Texas, Oct. 2018.
(Continued)

*Primary Examiner* — Yu-Hsi D Sun
(74) *Attorney, Agent, or Firm* — Dawn Jos; Charles A. Brill; Frank D. Cimino (57) ABSTRACT

A semiconductor package includes a metallic pad and leads, a semiconductor die attached to the metallic pad, the semiconductor die including an active side with bond pads opposite the metallic pad, a wire bond extending from a respective bond pad of the semiconductor die to a respective lead of the leads, a heat spreader over the active side of the semiconductor die with a gap separating the active side of the semiconductor die from the heat spreader, an electrically insulating material within the gap and in contact with the active side of the semiconductor die and the heat spreader; and mold compound covering the semiconductor die and the wire bond, and partially covering the metallic pad and the heat spreader, with the metallic pad exposed on a first outer surface of the semiconductor package and with the heat spreader exposed on a second outer surface of the semiconductor package.

15 Claims, 10 Drawing Sheets

(51) Int. Cl.
  *H01L 23/31* (2006.01)
  *H01L 21/48* (2006.01)
  *H01L 23/00* (2006.01)
  *H01L 25/16* (2006.01)

(52) U.S. Cl.
  CPC ........ *H01L 23/3121* (2013.01); *H01L 23/367* (2013.01); *H01L 24/05* (2013.01); *H01L 24/43* (2013.01); *H01L 24/45* (2013.01); *H01L 25/16* (2013.01); *H01L 2924/1304* (2013.01)

(56) References Cited

U.S. PATENT DOCUMENTS

| | | |
|---|---|---|
| 5,663,597 A | 9/1997 | Nelson et al. |
| 6,396,136 B2 | 5/2002 | Kalidas et al. |
| 6,574,107 B2 | 6/2003 | Jeon et al. |
| 7,135,759 B2 | 11/2006 | Efland et al. |
| 7,838,340 B2 | 11/2010 | Cruz et al. |
| 8,193,622 B2 | 6/2012 | Madrid |
| 8,299,588 B1 | 10/2012 | Tateishi et al. |
| 8,304,871 B2 | 11/2012 | Yu et al. |
| 8,354,303 B2 | 1/2013 | Lopez et al. |
| 8,450,149 B2 | 5/2013 | Bayan et al. |
| 8,524,532 B1 | 9/2013 | Joshi |
| 8,822,273 B2 | 9/2014 | Kuo et al. |
| 8,884,414 B2 | 11/2014 | Lee et al. |
| 8,946,880 B2 | 2/2015 | Saye |
| 9,177,945 B2 | 11/2015 | Saye |
| 9,300,222 B2 | 3/2016 | Moss |
| 9,373,571 B2 | 6/2016 | Denison et al. |
| RE46,466 E | 7/2017 | Lange et al. |
| 10,056,819 B1 | 8/2018 | Couleur et al. |
| 2007/0065984 A1 | 3/2007 | Lau et al. |
| 2009/0001561 A1* | 1/2009 | Chua ............ H01L 23/4334 257/717 |
| 2013/0127029 A1 | 5/2013 | Lee et al. |
| 2016/0005675 A1 | 1/2016 | Tong |
| 2016/0172279 A1 | 6/2016 | Cho |
| 2017/0125324 A1 | 5/2017 | Joshi et al. |
| 2019/0013288 A1 | 1/2019 | Kim et al. |

OTHER PUBLICATIONS

U.S. Appl. No. 16/222,920, titled Package With Dual Layer Routing Including Ground Return Path, filed Dec. 17, 2018.

U.S. Appl. No. 16/537,517, titled Package With Stacked Power Stage and Integrated Control Die, filed Aug. 9, 2019.

* cited by examiner

SEMICONDUCTOR PACKAGE WITH ISOLATED HEAT SPREADER

RELATED APPLICATION

This application claims the benefit of and priority to U.S. Provisional Application No. 62/955,206, filed Dec. 31, 2019, which is hereby fully incorporated herein by reference.

TECHNICAL FIELD

This disclosure relates to semiconductor packages.

BACKGROUND

Semiconductor technology continues trends towards miniaturization, integration, and speed. Electronic products in commercial applications such as telecom, home audio, and regulator products often need power supply systems, which can switch power supplies, regulate and stabilize voltages, and/or work as power converters, such as AC to AC, AC to DC, DC to AC and DC to DC converters.

Popular power switch systems involve a metal leadframe onto which a plurality of discrete electronic components are assembled and overmolded as a unit. In operation, the components have to stay cool by effectively dissipating heat through an exposed leadframe pad thermally coupled to heatsinks so that they can switch fast (fast transient response). In a common configuration, the exposed leadframe pad are thermally coupled to thermal vias of a printed circuit board (PCB) when a package is mounted to the PCB. An opposing side of the PCB includes a heatsink to dissipate heat from the package.

In general, the thermal handling capability of a semiconductor package may be improved by increasing the size of the package. For example, a larger package allows a larger exposed leadframe pad thereby facilitating increased conductive cooling from the package.

BRIEF SUMMARY

Packages disclosed herein include an exposed leadframe pad with a semiconductor die mounted thereon. The packages further include a heat spreader with an exposed surface on an opposite side of the package. The heat spreader is physically and electrically separated from the semiconductor die by an electrically insulating material. Heat from the semiconductor die is dissipated through the electrically isolated heat spreader and the leadframe pad. Such heat dissipation techniques facilitate a higher power density for a package than alternatives without a heat spreader and an exposed leadframe pad. In some examples, a semiconductor package includes a power stage and an integrated a control die for the power stage.

In one example, a semiconductor package includes a metallic pad and leads, a semiconductor die attached to the metallic pad, the semiconductor die including an active side with bond pads opposite the metallic pad, a wire bond extending from a respective bond pad of the semiconductor die to a respective lead of the leads, a heat spreader over the active side of the semiconductor die with a gap separating the active side of the semiconductor die from the heat spreader, an electrically insulating material within the gap and in contact with the active side of the semiconductor die and the heat spreader; and mold compound covering the semiconductor die and the wire bond, and partially covering the metallic pad and the heat spreader, with the metallic pad exposed on a first outer surface of the semiconductor package and with the heat spreader exposed on a second outer surface of the semiconductor package.

In another example, a semiconductor package includes a metallic pad and leads, a first semiconductor die attached to the metallic pad, the first semiconductor die including an active side with bond pads opposite the metallic pad, a first wire bond extending from a respective bond pad of the first semiconductor die to a respective lead of the leads, a second semiconductor die adjacent to the first semiconductor die on the pad, a second wire bond connecting a second bond pad of the first semiconductor die to a bond pad of the second semiconductor die, a heat spreader over the active side of the first semiconductor die with a gap separating the active side of the first semiconductor die from the heat spreader, an electrically insulating material within the gap and in contact with the active side of the first semiconductor die and the heat spreader, and mold compound covering the first semiconductor die, the first wire bond, the second semiconductor die, and the second wire bond, and partially covering the metallic pad and the heat spreader, with the metallic pad exposed on a first outer surface of the semiconductor package and with the heat spreader exposed on a second outer surface of the semiconductor package.

In another example, a method for fabricating a semiconductor package includes mounting a semiconductor die including bond pads on a metallic pad, the metallic pad being adjacent to leads of the semiconductor package, forming a wire bond between a respective bond pad of the bond pads and a respective lead of the leads, positioning an electrically insulating material adjacent to an active side of the semiconductor die, positioning a heat spreader adjacent to the electrically insulating material and thermally coupled to the electrically insulating material, and covering the semiconductor die and the wire bond with mold compound and partially covering the metallic pad and the heat spreader with the mold compound leaving the metallic pad opposite the semiconductor die exposed on a first outer surface of the semiconductor package and leaving the heat spreader opposite the semiconductor die exposed on a second outer surface of the semiconductor package.

DETAILED DESCRIPTION

As disclosed herein, a package may include an exposed leadframe pad with a semiconductor die mounted thereon. The package may further include a heat spreader with an exposed surface on an opposite side of the package. The heat spreader is physically separated from the semiconductor die by an electrically insulating material. Heat from the semiconductor die is dissipated through the electrically isolated heat spreader and the leadframe pad. Compared to alternatives that do not include a heat spreader, the disclosed techniques facilitate increased power density for a package.

The heat dissipation provided by the techniques disclosed herein may be particularly important in high voltage applications, such as voltages of at least 80 volts (DC and/or AC). Intelligent power modules combine power supply, regulation, and switching components with dedicated controllers. Intelligent power modules including high voltage power stages require significant cooling, which may be supported by the techniques disclosed herein.

The disclosed techniques further address integration of a control die with a power stage as part of an intelligent power module. With an integrated control die, the direct connection between a control die and a power stage is limited to the signal conductor within the package, limiting the impedance of the signal loop. Lower impedances facilitate faster switching and efficiency compared to techniques in which a control die is in a separate package from the power stage. However, such integration subjects control side components of an intelligent power module, which operate at a lower voltage and/or lower power compared to the power stage, to heat generated by the power stage. The cooling afforded by the techniques disclosed herein mitigates the heat generated by the power stage, improving the power density, and reliability, of such integrated packages.

The disclosed techniques are applicable to any semiconductor dies, and may be particularly useful higher frequency transmissions, such as gallium nitride (GaN) dies. For example, GaN architecture, such as GaN-on-silicon or GaN-on-silicon carbide, have been demonstrated as supporting higher frequencies as compared to silicon architecture or gallium arsenide architecture, such high higher frequencies benefiting from packages with power stages and integrated control dies. Package 10, as described with respect to FIGS. 1A-1E, provides one example of these techniques.

Figure 1A:
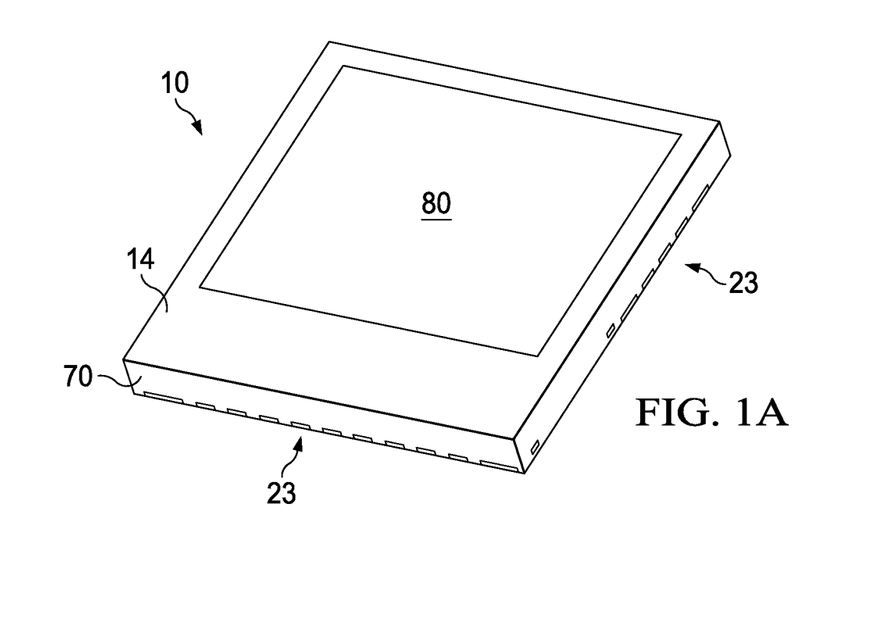
FIGS. 1A-1E illustrate a semiconductor package including a semiconductor die attached to a leadframe pad exposed on an outer surface of the package and a heat spreader on an opposite side of the semiconductor die exposed on an opposing outer surface of the package.
Figure 1B:
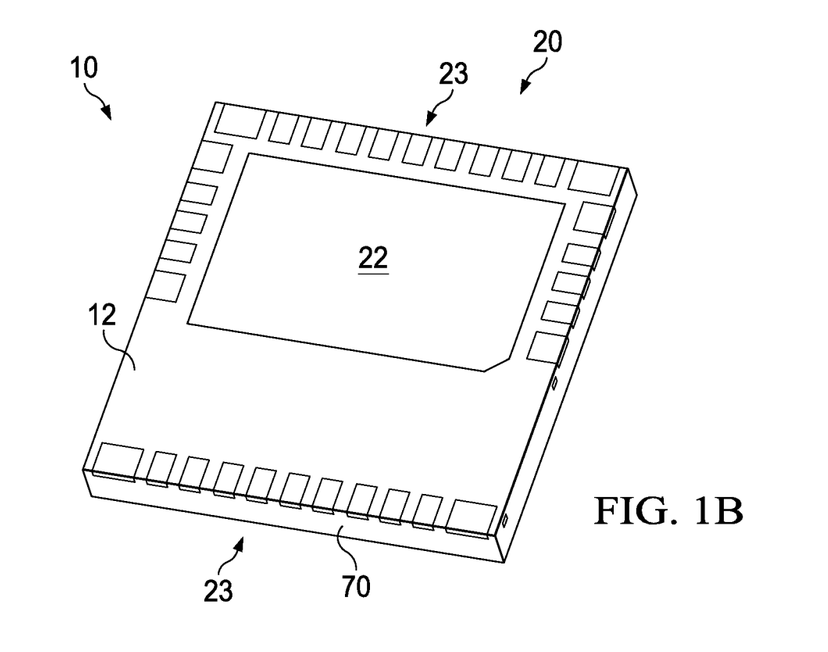
Figure 1C:
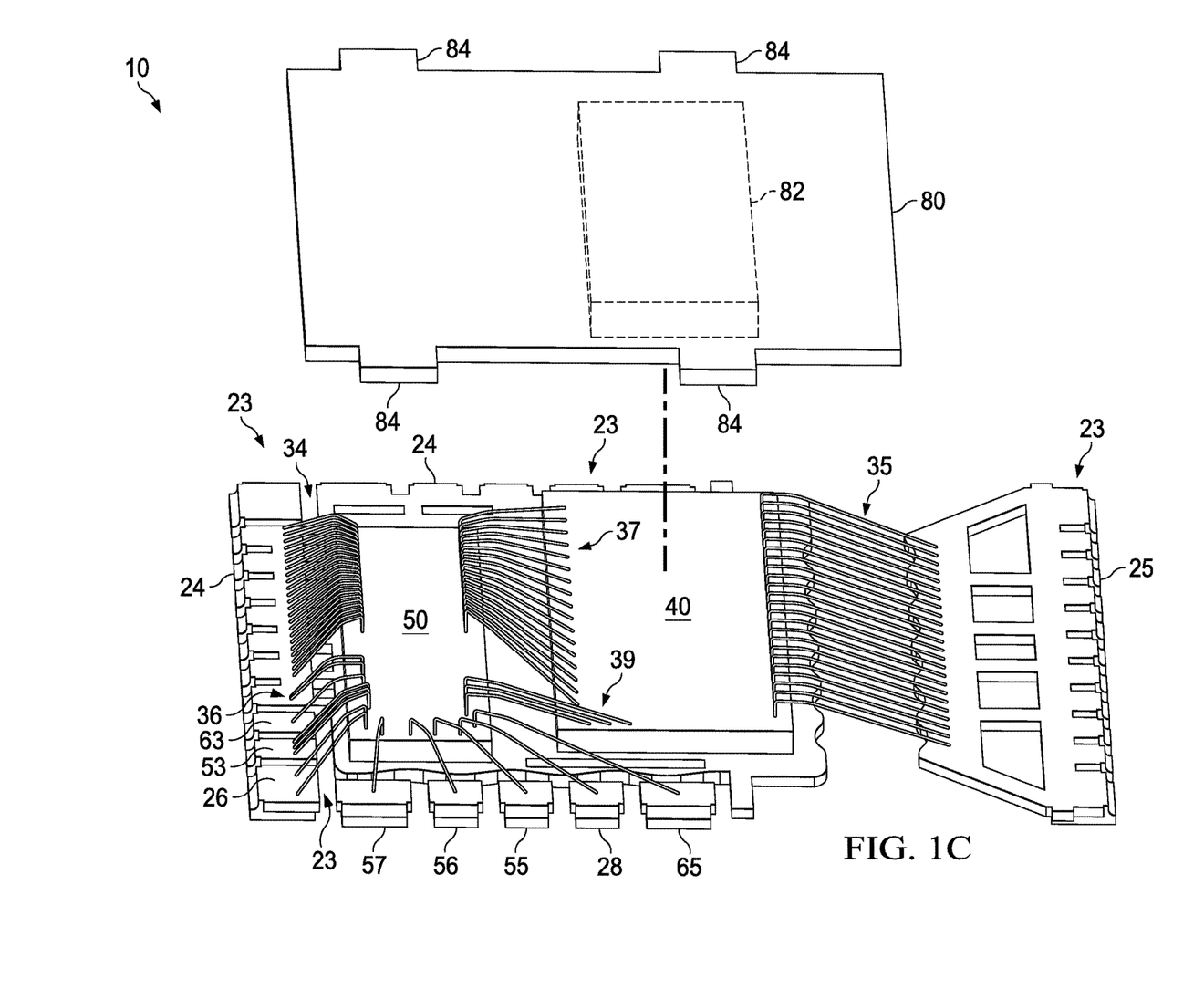
Figure 1D:
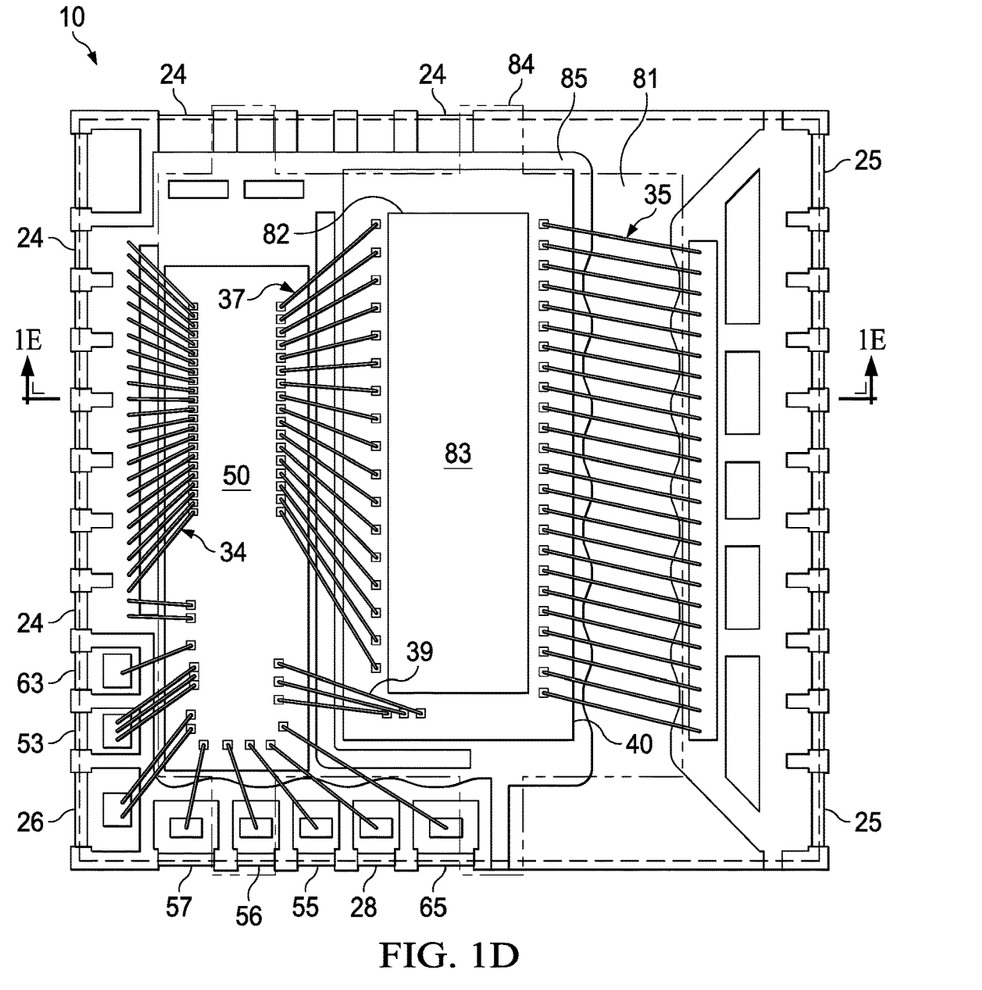
Figure 1E:
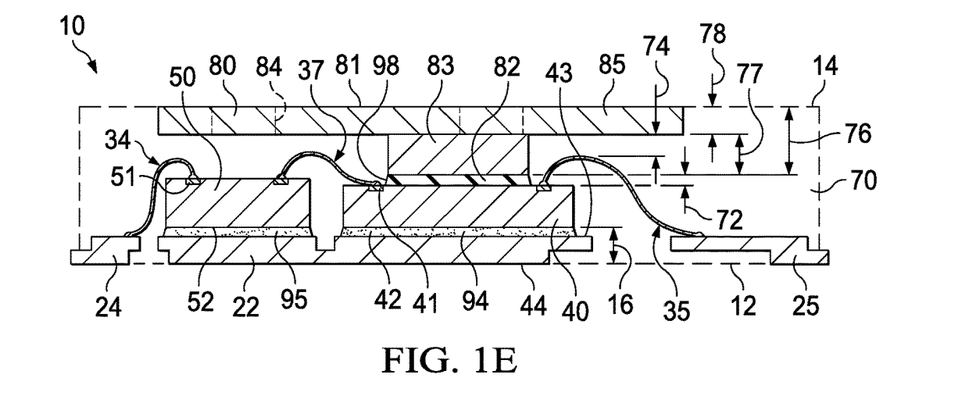

FIGS. 1A-1E illustrate semiconductor package 10. In particular, FIG. 1A is a top perspective view of package 10, while FIG. 1B is a bottom perspective view of package 10. FIG. 1C is an exploded view of package 10, but without mold compound 70. FIG. 1D is a top view of semiconductor package as viewed from a direction perpendicular to a planar surface of pad 22 of leadframe 20. In FIG. 1D, heat spreader 80 shown in hidden lines, and mold compound 70 is not shown. FIG. 1E is a cutaway side view of package 10.

Package 10 includes semiconductor die 40 with a power stage, such as a single channel power FET, and a control die 50 mounted adjacent side-by-side on surface 43 of metallic pad 22 of metallic leadframe 20. Semiconductor dies 40, 50 are electrically connected to metallic leads 23 of leadframe 20 and each other by way of wire bonds 34, 35, 36, 37, 39. Pad 22 is exposed on surface 12 of package 10, which facilitates conductive cooling from the passive sides of semiconductor dies 40, 50. Package 10 further includes heat spreader 80, which facilitates conductive cooling from the active side of semiconductor die 40, i.e., the side including bond pads 41.

Figure 3:
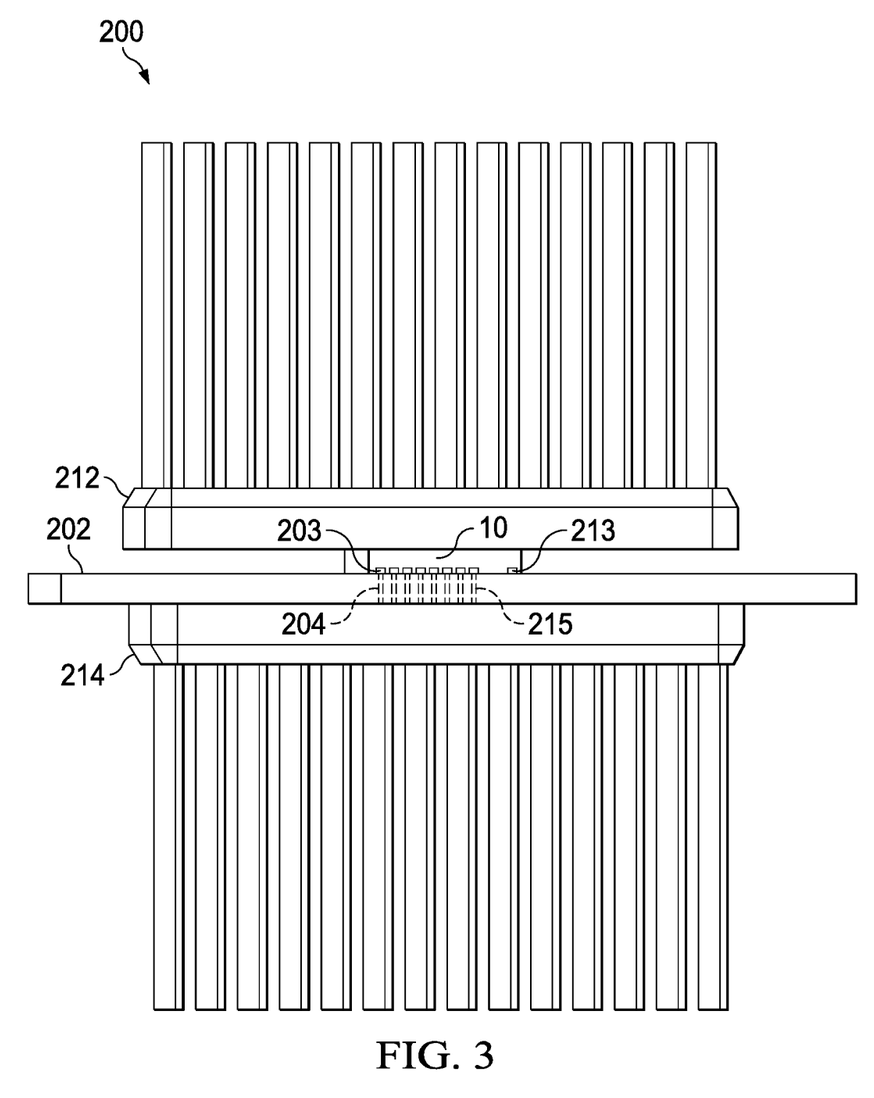
FIG. 3 illustrates an assembly of the semiconductor package mounted to a printed circuit board (PCB) with heatsinks on either side of the PCB to facilitate conductive cooling of the semiconductor package.

Leadframe 20 includes leads 23 and the aforementioned pad 22. Leads 23 provide electrical contacts for connection to external components, such as via a PCB, such as PCB 202 (FIG. 3). In the example of semiconductor package 10, leads 23 are shaped as flat leads or pins, and semiconductor package 10 may represent a Quad Flat No-Lead (QFN) package. In other examples, leads 23 may have other configurations, including but not limited to, a shape conforming to Small Outline No-Lead (SON) devices or cantilevered leads.

Leadframes, such as leadframe 20, are formed on a single, thin sheet of metal as by stamping or etching. In various examples, the base metal of leadframe 20 may include copper, copper alloys, aluminum, aluminum alloys, iron-nickel alloys, or nickel-cobalt ferrous alloys. For many devices, parallel surfaces of the flat leadframe base metal are treated to create strong affinity for adhesion to plastic compound, especially mold compounds. As an example, the surfaces of metal leadframes may be oxidized to create a metal oxide layer, such as copper oxide. Other methods include plasma treatment of the surfaces, or deposition of thin layers of other metals on the base metal surface. In some examples, the planar base metal may be plated with a plated layer enabling metal-to-metal bonding and resistant to oxidation. In an example, the plated layer may include a layer of nickel plated on the base metal and a layer of palladium plated on the nickel layer. Some of such examples, a layer of gold may be plated on the palladium layer. As an example for copper leadframes, plated layers of tin may be used, or a layer of nickel, about 0.5 to 2.0 µm thick in some examples, followed by a layer of palladium, about 0.01 to 0.1 µm thick in the same or different examples, optionally followed by an outermost layer of gold, about 0.003 to 0.009 µm thick in the same or different examples. Such base metal and plating combinations provide resistance to corrosion, such as oxidation, at exposed portions of the leadframe while facilitating wire bonds between leadframe 20 and bond pads 41 of semiconductor die 40.

While leadframe 20 includes thirty-two leads 23, the techniques of this disclosure may be applied to any package configuration with leads or leads. For example, other semiconductor packages may include more or less leads, such as at least six leads, at least eight leads, at least sixteen leads, or even more than thirty-two leads.

Leads 23 include power stage source leads 24, power stage drain leads 25, control power input lead 26, control input lead 28, negative gate supply output lead 53, drive strength selection lead 55, low power mode lead 56, internal buck-boost converter switch pin lead 57, power output lead 63, and fault output lead 65. These leads 23 are merely examples and leadframe 20 may include fewer, different leads, or additional leads configured to connect to external components as needed to support the operation of package 10. Details regarding the functions of semiconductor package 10 with respect to the particular example of these leads 23 are discussed with respect to the block diagram of FIG. 2.

Pad 22 is coupled to power stage source leads 24. Semiconductor dies 40, 50 are bonded on pad 22 with die attach adhesive. For example, inactive side 42 of semiconductor die 40 may be secured to surface 43 with die attach adhesive 94, whereas inactive side 52 of control die 50 may be secured to surface 43 with die attach adhesive 95. Groove 45 separates semiconductor dies 40, 50 on surface 43, and may be used to restrict flow of die attach adhesives 94, 95 during bonding.

The die attach adhesives 94, 95 may include a plurality of components including a resin. The resin may include epoxy resins, polyurethane resins, and/or silicone resins. The resin may be filled or unfilled and die attach adhesive may further include one or more of the following: hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE (to match die), increase thermal conductivity, increase elastic modulus of the die attach adhesive compared to the resin base. Particulate fillers may be selected to reduce strength characteristics such as tensile strength and flexural strength compared to the resin base materials.

Semiconductor package 10 further includes wire bonds that provide electrical connection between leads 23 and semiconductor dies 40, 50. Semiconductor die 40 includes a plurality of bond pads 41, and control die 50 includes a plurality of bond pads 51 to facilitate the wire bond connections. Wire bonds 34, 36 connect leads 23 to bond pads 51 of control die 50, and wire bonds 35 connect leads 23 to bond pads 41 of semiconductor die 40. Wire bonds 37, 39 connect bond pads 41 to bond pads 51.

Bond pads 51 include a control input, a gate drive output, and a control power input. Specifically, the control input is electrically coupled to control input lead 28, the gate drive output is electrically coupled to the power stage gate wire bonds 39, and the control power input is electrically coupled to control power input lead 26. Bond pads 41 include power stage source, power stage drain and a power stage gate. The power stage source is electrically coupled to power stage source leads 24 via wire bonds 34, control die 50 and wire bonds 37. Similarly, the power stage drain is electrically coupled to the power stage drain leads 25 via wire bonds 35, and the power stage gate is electrically coupled to control die 50 via power stage gate wire bonds 39.

Power stage source wire bonds 34 electrically connect power stage source leads 24 to bond pads 51. In turn, wire bonds 37 electrically connect power stage source leads 24 to semiconductor die 40 via control die 50. In some examples, control die 50 may simply include pass-through conductors for the power stage source. Power stage drain wire bonds 35 electrically connect power stage drain leads 25 to bond pads 41. In addition, power stage gate wire bonds 39 provides connection for control signals between control die 50 and semiconductor die 40.

Figure 2:
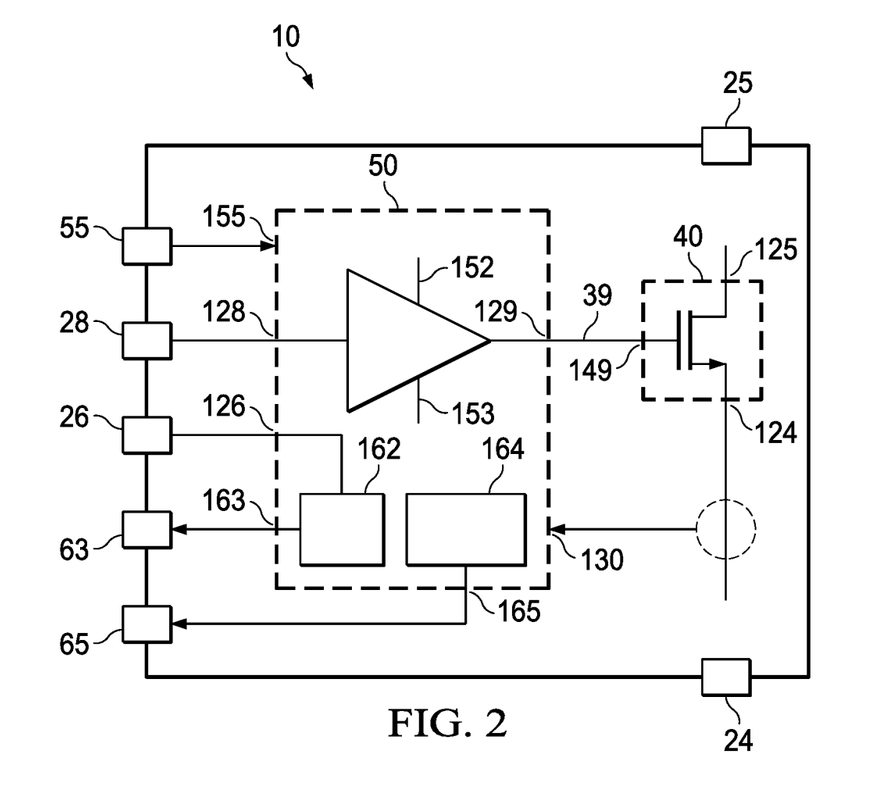
FIG. 2 is a simplified block diagram of one example configuration of the semiconductor package of FIGS. 1A-1E.

Exposed surface 44 of pad 22 opposite semiconductor die 40 is exposed on an outer surface 12 of semiconductor package 10, and exposed surface 81 of exposed pad 85 of heat spreader 80 opposite semiconductor die 40 is also exposed on outer surface 14 of semiconductor package 10. The exposed surfaces of pad 22 and heat spreader 80 facilitate heat transfer from semiconductor die 40 to the external environment. Such heat transfer may be further improved by positioning the exposed surface of heat spreader 80 on a heatsink. Likewise, the exposed surface of pad 22 may also be thermally coupled to a heatsink, for example, by way of thermal vias, as with assembly 200 (FIG. 2).

Exposed pad 85 includes tie bars 84. Tie bars 84 remain from assembly techniques using a heat spreader strip with an array of interconnected heat spreaders as shown with respect to FIGS. 4A and 4B. Heat spreader 80 further forms a protrusion 83 extending from the underside of exposed pad 85. Protrusion 83 includes a contact pad 82, which is sized to be adjacent the active side of semiconductor die 40 inside a perimeter of bond pads 41 and associated wire bonds. Exposed surface 81 is larger than contact pad 82 to improve the conduction of heat from semiconductor die 40 to external surface 14 of package 10. As shown in FIG. 1D, exposed pad 85 with exposed surface 81 is over wire bonds 35, 37, 39 as viewed from a direction perpendicular to a planar surface of pad 22. Exposed pad 85 with exposed surface 81 is also over a portion of control die 50 and wire bonds 34, 36.

In some examples, heat spreader 80 may be a metallic heat spreader formed from a metal, such as copper or a copper alloy. However, heat spreader 80 is electrically isolated from the electronic components of package 10, including semiconductor dies 40, 50 and leadframe 20. For example, package 10 includes electrically insulating material 98 adjacent to the active side of semiconductor die 40. Contact pad 82 of heat spreader 80 is adjacent to electrically insulating material 98 and thermally coupled to semiconductor die 40 via electrically insulating material 98. In various examples, electrically insulating material 98 may include mold compound 70, a non-conductive thermal interface material, and/or a ceramic shim. A thermal contact area between electrically insulating material 98 and the active side of semiconductor die 40 is smaller than exposed surface 81.

In addition to avoiding direct contact between heat spreader 80, semiconductor die 40 and wire bonds 34, 35, 36, 37, 39, clearance is required to prevent shorting between heat spreader 80 and such electrical conductors. The required clearance will vary according to the design and reliability ratings of package 10, such as dielectric qualities of electrically insulating material 98, and the voltage and amplitude of current through the conductors of package 10, in particular, high side conductors such as wire bonds 34, 35, 37.

As shown in FIG. 1E, in some particular examples, a gap 72 of at least 50 micrometers (μm), such as at least 100 μm, such as at least 150 μm may be maintained between the active surface of semiconductor die 40 and contact pad 82 of heat spreader 80. In the same or different examples, gap 72 may be no more than 500 μm, such as no more than 250 μm to support conductive cooling through electrically insulating material 98. Generally speaking, electrically insulating material 98 will have a lower thermal conductivity than heat spreader 80 because of the electrically insulating properties of electrically insulating material 98. For this reason, limiting a width of the gap 72 improves conductive cooling of semiconductor die 40 via heat spreader 80.

Exposed pad 85 thickness 78 is thinner than total thickness 76 of heat spreader 80 to provide clearance with wire bonds. For example, wire bonds 35, 37, 39 have standoff heights above the active side of semiconductor die 40, and wire bonds 34, 36, 37, 39 have standoff heights above the active side of control die 50. In some examples, these standoff heights may be at least 100 μm, such as about 125 μm. In some particular examples, gap 74 of at least 50 μm, such as at least 100 μm, such as at least 150 μm may be maintained between wire bonds 34, 36, 37, 39 and the underside of exposed pad 85. In the same or different examples, gap 74 may be no more than 500 μm, such as no more than 250 μm to support conductive cooling through electrically insulating material 98. The size and shape of protrusion 83 is selected to maintain a minimum desired gap 74 according to design constraints. For example, the thickness of protrusion 83 relative to the underside of exposed surface 81 provides clearance between the standoff height of the wire bonds and the underside of exposed pad 85.

While it is generally preferable to limit thicknesses of components within package 10, a thickness of heat spreader 80 may be selected to improve heat dissipation from semiconductor die 40. For example, thickness 76 of heat spreader 80 may be greater than thickness 16 of leadframe 20. In some specific examples, heat spreader 80 may have a thickness 76 at least twice thickness 16 of leadframe 20. In any of such examples, thickness 77 of protrusion 83 may represent 25 percent to 75 percent of a total thickness 76 of heat spreader 80, with the remainder being thickness 78 of exposed pad 85. In particular examples, thickness 77 of protrusion 83 may represent 40 percent to 60 percent of total thickness 76 of heat spreader 80, such as about 50 percent of total thickness 76 of heat spreader 80. In the same or different examples, heat spreader 80 may have a total thickness 76 of at least 300 such as at least 400 such as about 500 while leadframe 20 has a thickness 16 of less than 250 such as about 200 As used herein, the term, "about" means within the range of manufacturing tolerances associated with the particular element being described numerically.

While package 10 may include any semiconductor die architecture, its improved heat dissipation may be particularly useful for semiconductor die 40 and/or control die 50 utilizing higher frequency transmissions. For example, one or both of semiconductor die 40 and control die 50 may include GaN architecture, such as GaN-on-silicon or GaN-on-silicon carbide. In the same or different examples, one or both of semiconductor die 40 and control die 50 may include silicon architecture and/or gallium arsenide architecture. In one particular example, semiconductor die 40 may include GaN architecture, and control die 50 may include silicon architecture.

In addition, control die 50 may be specifically tuned to for a GaN configuration for semiconductor die 40 for fast driving while mitigating ringing on the gate. For example, control die 50 may be configured to keep semiconductor die 40 off for high drain slew rates, such as slew rates up to 150 V/ns. In addition, control die 50 may protect against faults by providing over-current protection, over-temperature protection, and/or under voltage lockout for semiconductor die 40. As control die 50 is an integrated component of package 10, the fault protection may be designed according to the specifications of semiconductor die 40, thereby simplifying the design of electronics utilizing package 10 as compared to alternatives in which fault protection for a semiconductor die is provided by separate components.

Mold compound 70 forms an overmold covering semiconductor die 40 and wire bonds 34, 35, 36, 37, 39, and partially covering pad 22 and heat spreader 80. In this manner, mold compound 70 provides a protective outer layer for the electric components of package 10. In some examples, mold compound 70 includes an epoxy such as an epoxy-based thermoset polymer.

Package 10 may be operated as a component of an intelligent power supply or other power control device. In various examples, package 10 may be utilized as part of a half-bridge, a boost converter, a buck converter, and others.

In such examples, semiconductor die 40 may represent a single power stage or include multiple power stages. In other example, more than one semiconductor die including a power stage may be integrated into a package. In such examples, a heat spreader may include multiple protrusions configured to support conductive cooling from the active sides of each semiconductor die including a power stage, as described with respect to package 510 of FIG. 7.

FIG. 2 illustrates a specific example simplified block diagram of an example configuration of semiconductor package 10 where semiconductor die 40 represents a single channel power FET. Control die 50 is configured to control switching of the power FET of semiconductor die 40 with an electrical signal over power stage gate wire bonds 39 via its gate drive output 129.

In many examples, semiconductor die 40 with its power FET operates at a higher current and/or voltage than control die 50. For example, a voltage rating of the power FET for either source 124 or drain 125 may be at least 100 volts, such as at least 200 volts, such as at least 400 volts. In contrast, the power FET of semiconductor die 40 may be operable via power stage gate 149 with a signal providing no more than ten percent of the voltage rating of the power FET for either source 124 or drain 125, such as a signal of less than two percent of the voltage rating, such as voltage of less than 15 volts.

As shown in FIG. 2, semiconductor die 40 includes an electrical contact forming source 124, which connects to source leads 24 and an electrical contact forming drain 125 which connects to drain leads 25 via wire bonds 35. While only a single source and drain are shown in the block diagram, package 10 utilizes a number of leads, wire bonds and semiconductor die bond pads for each of source 124 and drain 125 to facilitate high current operation of semiconductor die 40. Semiconductor die 40 further includes power stage gate 149 electrically coupled to power stage gate wire bonds 39.

In addition, package 10 includes a number of leads electrically connected to control die 50 via wire bonds 35. Specifically, control power input 126 is electrically coupled to control power input lead 26, control input 128 is electrically coupled to control input lead 28, drive strength selection 155 electrically coupled to drive strength selection lead 55, power output 163 electrically coupled to power output lead 63, and fault output 165 electrically coupled to fault output lead 65. In addition, gate drive output 129 is electrically coupled to power stage gate wire bonds 39, and ground contact 130 is electrically coupled to ground.

Drive strength selection lead 55 is configurable to adjust a slew rate to control stability and ringing in the circuit, as well as an adjustment to pass electro-magnetic compliance (EMC) standards. In some examples, a resistor may be electrically connected the drive strength selection lead 55 and ground. The value of the resistor determines the slew rate of the device during turn-on, such as between approximately 25 V/ns and 100 V/ns. The slew rate adjustment can be used to control the following aspects of the power FET of semiconductor die 40: switching loss in a hard-switched converter, radiated and conducted EMI generated by the switching stage, interference elsewhere in the circuit coupled from the switch node, and/or voltage overshoot and ringing on the switch node due to power loop inductance and other parasitics. When increasing the slew rate, the switching power loss will decrease, as the portion of the switching period where the switch simultaneous conducts high current while blocking high voltage is decreased. However, by increasing the slew rate of the device, the other three aspects of the power FET become less desirable.

Control power input lead 26 may supply both power output lead 63 and gate drive supply 152. For example, power converter circuit 162 may provide a required power (such as 5 volts DC) for power output lead 63 and gate drive supply 152 by converting a power received via control power input lead 26, which may be at a different potential (such as 12 volts DC). In addition, negative gate supply output 153 is coupled to negative gate supply output lead 53. In some examples, negative gate supply output lead 53 should be bypassed to source leads 24 with an external capacitor. In some examples, power output lead 63 may be electrically connected to an external digital isolator.

In the example of FIG. 2, circuit 162 may include passive components (not shown) electrically coupled to control die 50 to provide power conversion, or control die 50 may integrate such components. Likewise, sensing circuit 164 may include passive components electrically coupled to control die 50 to provide sensing functions for over-current protection, over-temperature protection, and/or under voltage lockout for semiconductor die 40, or control die 50 may integrate such components. For example, sensing circuit 164 may provide current sensing and/or voltage sensing for source 124 and/or drain 125. As another example, sensing circuit 164 may provide temperature sensing for semiconductor die 40 or package 10 generally. Detected faults may be output over fault output 165 via fault output lead 65.

While not specifically shown in the simplified block diagram of FIG. 2, control die 50 further provides selectable operating parameters via drive strength selection lead 55, low power mode lead 56, and internal buck-boost converter switch pin lead 57. For example, drive strength selection lead 55 may be used to set the turn-on drive strength to control slew rate of control die 50 by, for example, connecting a resistor from drive strength selection lead 55 to ground. Low power mode lead 56 may be used to enable low-power-mode by, for example, connection to source. In addition, internal buck-boost converter switch pin lead 57 supports internal buck-boost converter, for example, when connected to an inductor that is further connected to source 124.

In a variety of examples, semiconductor die 40 forms at least one power stage, such as a field effect transistor (FET), a junction FET (JFET), a metal-oxide-semiconductor field-effect transistor (MOSFET), a metal-semiconductor field-effect transistor (MESFET), an insulated-gate bipolar transistor (IGBT), a bipolar junction transistor (BJT), a thyristor, an integrated gate commutated thyristor (IGCT), a silicon controlled rectified (SCR), a triode for alternating current (TRIAC), a high electron mobility transistor (HEMT), a uni junction transistor (UJT), or other power stage or combination thereof. In various examples, semiconductor die 40 may form more than one power stage, such as a half bridge, a power converter, such as a Buck converter or boost converter, or other power switch configuration. Any suitable semiconductor technology may be used for semiconductor die 40 and the power stage(s), including, but not limited to, silicon, GaN, silicon carbide (SiC), aluminum nitride (AlN), indium nitride (InN), boron nitride (BN), and silicon-germanium (SiGe). Control die 50 is a semiconductor die, such as an integrated circuit, configured to control the power switch elements of semiconductor die 40.

In addition, the functionality of power stage gate wire bonds 39, power stage source leads 24, and power stage drain leads 25 may vary according to the power stage configuration of semiconductor die 40. For example, in an implementation in which semiconductor die 40 includes a BJT power stage, power stage gate wire bonds 39 may connect to a base of the BJT, power stage source leads 24 may connect to an emitter of the BJT, and power stage drain leads 25 may connect to a collector of the BJT. Thus, while the terms gate, source, and drain are generally associated with FET power stages, the techniques disclosed herein also apply to other power stages, such as IGBT, BJT, thyristor, IGCT, SCR, TRIAC, HEMT, and UJT power stages.

FIG. 3 illustrates an assembly 200 of semiconductor package 10 mounted to a printed circuit board (PCB) 202 with heatsinks 212, 214 on either side of PCB 202 to facilitate conductive cooling of semiconductor package 10. PCB 202 includes a set of electrical contacts 203 on a first side of the PCB 202, and thermal vias 204 located adjacent the set of electrical contacts and extending through a thickness of the PCB 202 to a second side of the PCB 202. Semiconductor package 10 is mounted to the PCB 202 with leads 23 electrically connected to electrical contacts 203 and pad 22 adjacent and thermally coupled to thermal vias 204.

Heatsink 212 is adjacent and thermally coupled to heat spreader 80 on the first side of PCB 202. Assembly 200 may further include a thermal interface material 213 between heatsink 212 and heat spreader 80 thermally coupling heat spreader 80 to heatsink 212. Assembly 200 further includes heatsink 214 adjacent and thermally coupled to thermal vias 204 on the second side of PCB 202 opposite semiconductor package 10. Assembly 200 may further include a thermal interface material 215 between heatsink 214 and the thermal vias 204 thermally coupling thermal vias 204 to heatsink 214. Any suitable thermal interface materials may be selected for use as thermal interface materials 213, 215, such conductive or nonconductive thermal tapes or pastes.

Figure 4A:
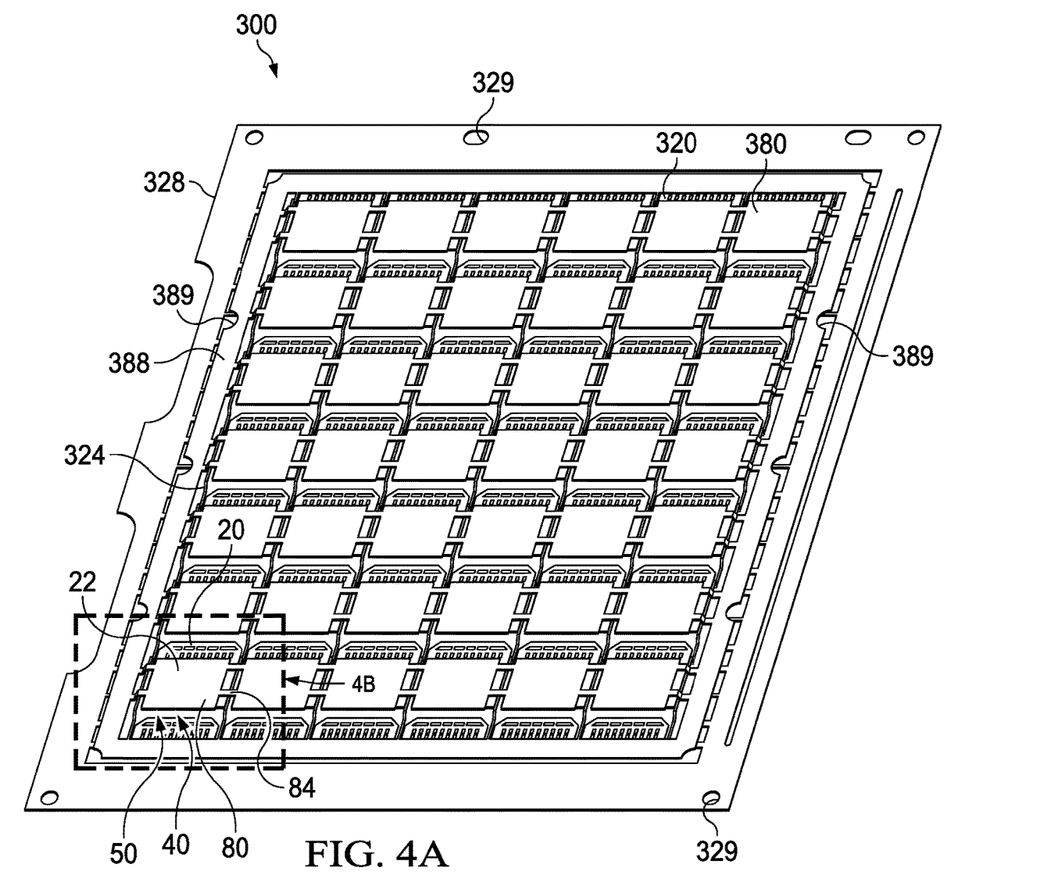
FIGS. 4A and 4B illustrate an assembly of semiconductor dies attached to leadframe pads of a leadframe strip and a heat spreader strip positioned to thermally couple a plurality of heat spreaders to the semiconductor dies.
Figure 4B:
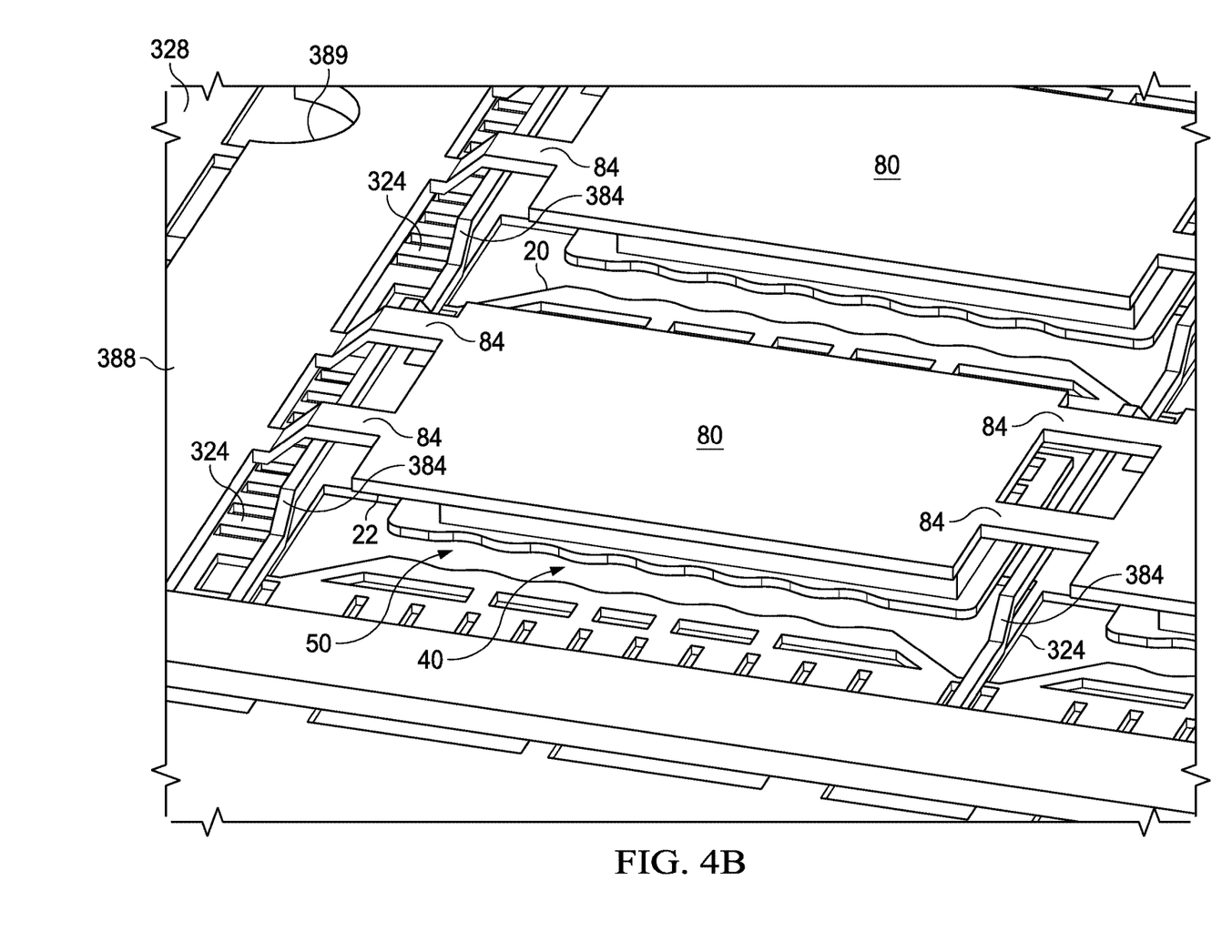

FIGS. 4A and 4B illustrate an assembly 300 of semiconductor dies 40, 50 attached to leadframe pads 22 of a leadframe strip 320 and a heat spreader strip 380 positioned to thermally couple a plurality of heat spreaders to semiconductor dies 40 attached to the leadframe pads 22. FIG. 4A is a perspective view of assembly 300, while FIG. 4B is a close-up perspective view of a portion of assembly 300 as indicated in FIG. 4A.

Leadframes, such as leadframe 20, are formed on a single sheet of metal by stamping or etching. Leadframe strip 320 includes multiple interconnected leadframes 20 formed from a single sheet of substrate. Leadframes 20 on the sheet are arranged in rows and columns. Tie bars 324 interconnect elements of a leadframe, such as pads 22 and leads 23, to one another as well as to elements of adjacent leadframes. Siderail 328 surrounds the array of leadframes 20 to provide rigidity and support leadframe elements on the perimeter of leadframe strip 320. Siderail 328 includes alignment features 329 to aid in manufacturing. Components, such as semiconductor dies 40, 50 are mounted to each of the leadframes of leadframe strip 320.

As discussed with respect to FIGS. 1A-1E, while semiconductor dies 40, 50 are bonded to pad 22, bond pads of semiconductor dies 40, 50 are electrically connected to each other and to leads 32 with wire bonds 34, 35, 36, 37, 39. Wire bonds 34, 35, 36, 37, 39 each include a metal wire extending from a respective bond pad to a respective lead 23 or bond pad. The metal wires are made of electrically conductive materials, such as copper, gold, or aluminum. Each of wire bonds 34, 35, 36, 37, 39 include a ball bond by a squashed ball attached the respective bond pad of one of semiconductor dies 40, 50, and a stitch bond attached to the respective lead 23 or bond pad.

Following the wire bonding, heat spreader strip 380 is then positioned over semiconductor dies 40, 50 and wire bonds 34, 35, 36, 37, 39 to facilitate a transfer molding process, followed by singulation. More specifically, heat spreader strip 380 is positioned in alignment with leadframe strip 320 following the placement of the components, such as semiconductor dies 40, 50. Like leadframe strip 320, heat spreader strip 380 includes multiple interconnected heat spreaders 80 formed from a single sheet of substrate. Heat spreaders 80 on the sheet are arranged in rows and columns matching the leadframes 20 of leadframe strip 320. Tie bars 84, 384 interconnect adjacent heat spreaders 80 in heat spreader strip 380. Tie bars 84, 384 also include bends within heat spreader strip 380 to offset heat spreaders 80 by certain height from leadframes 20. This example is particularly useful for providing a defined gap between each heat spreader 80 and semiconductor die 40. In such examples, the gap may be filled with mold compound 70 during a standard molding process, the mold compound that fills the gap representing electrically insulating material 98 as shown in the figures. Siderail 388 surrounds the array of heat spreader strip 380 to provide rigidity and support heat spreaders 80 on the perimeter of heat spreader strip 380. Siderail 388 includes alignment features 389 to aid in manufacturing, such as facilitating alignment of individual heat spreaders with semiconductor dies 40 attached to pads 22 of leadframes 20.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser, within spaces separating the semiconductor dies from each other. These singulation cuts separate the leadframe strip into separate semiconductor packages, each semiconductor package including a singulated leadframe, at least one die, electrical connections between the die and leadframe (such as gold or copper wire bonds) and the mold compound which covers at least part of these structures.

Tie bars and siderails, such as tie bars 324, 84, and siderails 328, 388 are removed during singulation of the packages formed with a single leadframe strip 320. The term leadframe of represents the portions of the leadframe strip remaining within a package after singulation. With respect to semiconductor package 10, leadframe 20 includes pad 22 and thirty-two leads 23, although some of these elements are not interconnected following singulation of semiconductor package 10 into a discrete package.

FIGS. 5A-5D illustrate conceptual process steps for manufacturing plurality of semiconductor packages with isolated heat spreaders with leadframe strip 320 and heat spreader strip 380. FIG. 6 is a flowchart of a method of manufacturing a semiconductor package including a semiconductor die attached to a leadframe pad exposed on an outer surface of the package and a heat spreader on an opposite side of the semiconductor die exposed on an opposing outer surface of the package, such as the semiconductor package of FIGS. 1A-1E. For clarity, the method of FIG. 6 is described with reference to semiconductor package 10 and FIGS. 5A-5D; however, the described techniques may be adapted to other package designs and are not limited to the specific example of semiconductor package 10.

Figure 5A:
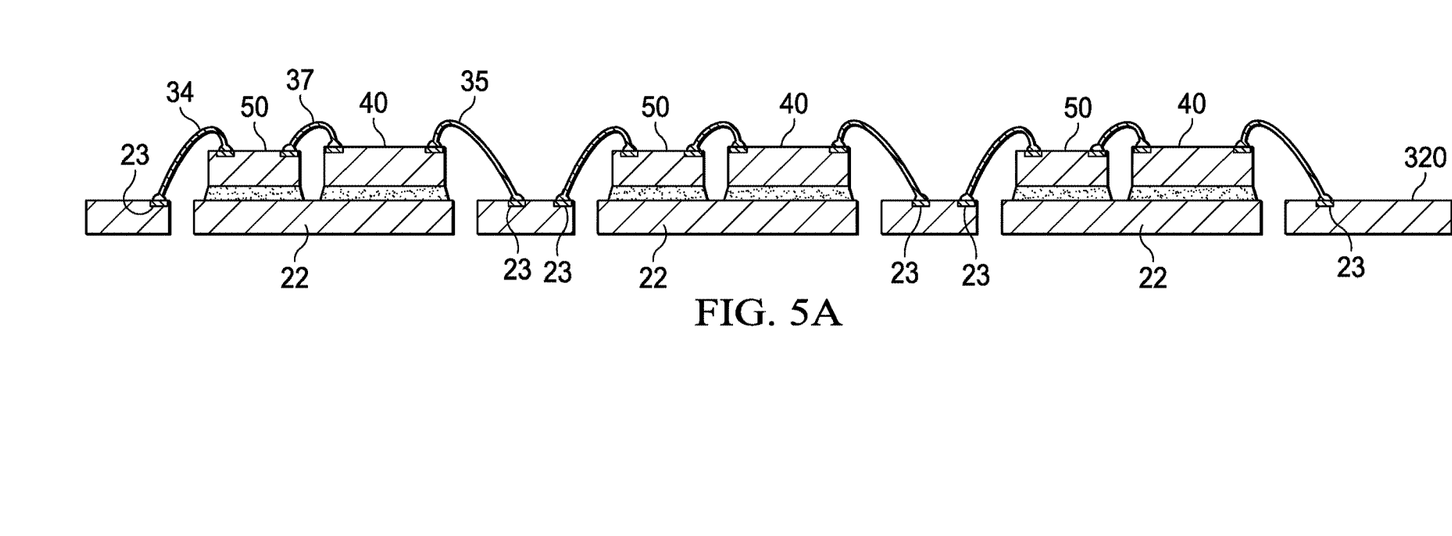
FIGS. 5A-5D illustrate conceptual process steps for manufacturing the semiconductor package of FIGS. 1A-1E using a leadframe strip.
Figure 6:
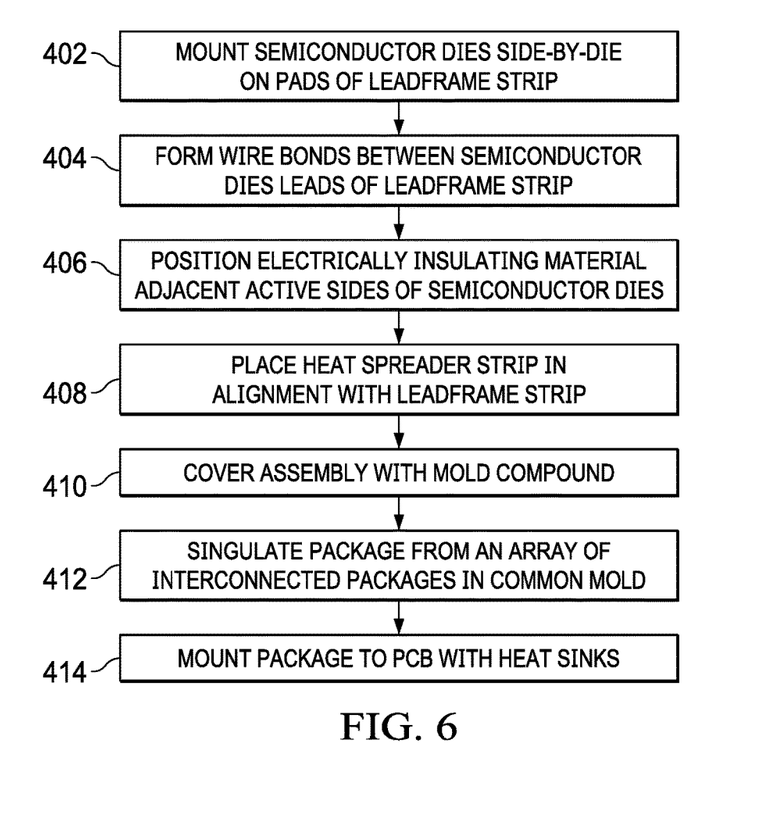
FIG. 6 is a flowchart of a method of manufacturing a semiconductor package including a semiconductor die attached to a leadframe pad exposed on an outer surface of the package and a heat spreader on an opposite side of the semiconductor die exposed on an opposing outer surface of the package, such as the semiconductor package of FIGS. 1A-1E.

As shown in FIG. 5A, semiconductor dies 40, 50 are mounted side-by side on pads 22 of leadframes 20 of leadframe strip 320. (FIG. 6, step 402). For example, semiconductor die 40 may be secured to pads 22 with die attach adhesive 94, whereas control die 50 may be secured to pads 22 with die attach adhesive 95. Also shown in FIG. 5A, wire bonds 34, 35, 37, as well as wire bonds 36, 39 (not shown), are made between semiconductor dies 40, 50 and leads 23 for each of leadframes 20 (FIG. 6, step 404).

With the wire bonding process, the wire is strung through the capillary of an automated bonder. A capillary is an elongated tube of an inert material such as a ceramic with a fine bore (the capillary in the strict sense) suitable for guiding a metal wire used to form the wire bonds. At the wire end extruding from the capillary tip, a free air ball may be created by melting the wire end using either a flame or a spark technique. The capillary is moved towards an attachment area of either leadframe 20 or bond pads of one of semiconductor dies 40, 50. For a bond pad, the attachment area may be an alloy of aluminum and copper, for an attachment area of the leadframe, the attachment area may consist of the leadframe base metal or include one of the coating metal discussed above. The free air ball of melted wire is pressed against the metallization of the attachment area by a compression force, often combined with ultrasonic movement of the ball relative to the attachment area, transmitting ultrasonic energy, in order to create a ball bond.

After the ball attachment, the capillary with the wire may be lifted to span an arch from the ball bond, to an attachment area on a substrate or a leadframe, such as a lead stitch area of one of leads 23 or one of the bond pads of semiconductor dies 40, 50 for wire bonds 37, 39. When the wire touches the attachment area surface, the capillary tip is pressed against the wire in order to flatten it and thus to form a stitch bond, sometimes referred to as a wedge bond.

Making the wire bonds may include first positioning semiconductor dies 40, 50 on a heated pedestal to raise the temperature to between 150 and 300° C. For copper and aluminum wires, ball formation and bonding may be performed in a reducing atmosphere such as dry nitrogen gas with a few percent hydrogen gas.

Figure 5B:
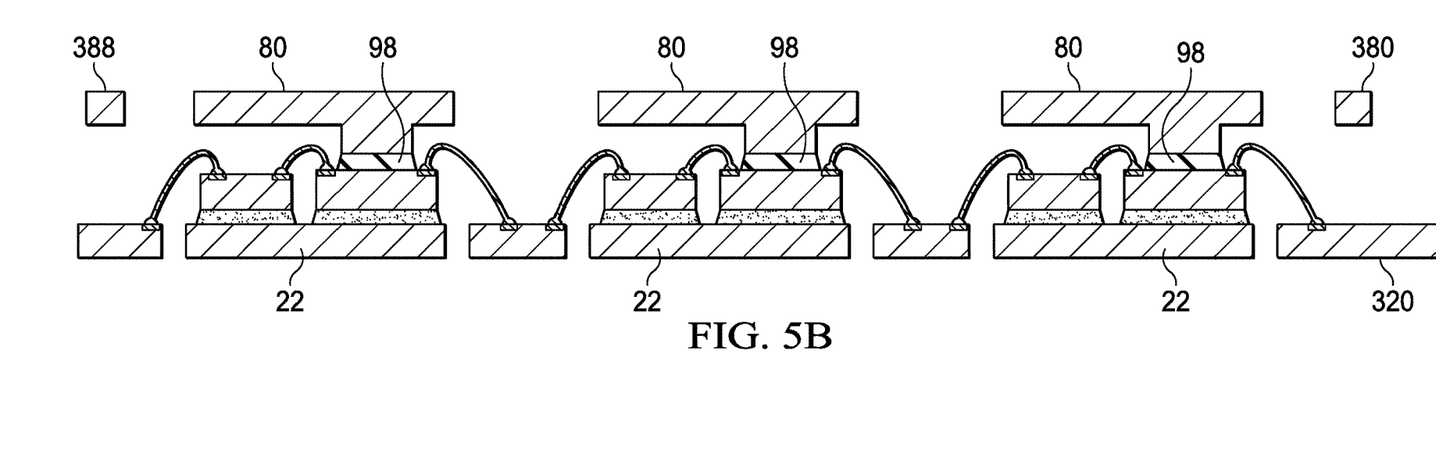
Figure 5C:
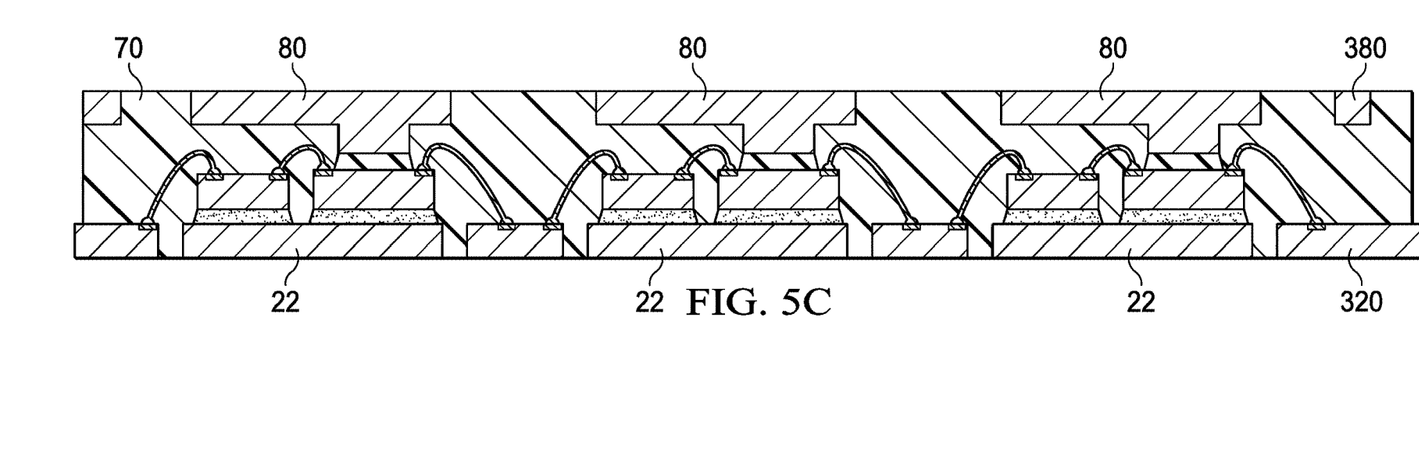

As shown in FIG. 5B, electrically insulating material 98 is positioned adjacent to the active side of each semiconductor die 40 (FIG. 6, step 406). As shown in FIG. 5B, heat spreader strip 380 is placed in alignment with leadframe strip 320 such that each heat spreader 80 is positioned adjacent to the electrically insulating material 98, thereby thermally coupling heat spreader 80 to the electrically insulating material 98 (FIG. 6, step 408). In various examples, electrically insulating material 98 may include mold compound 70, a non-conductive thermal interface material, and/or a ceramic shim. In the example of using mold compound 70 as electrically insulating material 98, mold compound 70 may simply fill a gap between heat spreader 80 and semiconductor die 40 during the molding of mold compound 70 as shown in FIG. 5C rather than prior to molding. In other examples, electrically insulating material 98 may be applied to each heat spreader 80 before placement of heat spreader strip 380 in alignment with leadframe strip 320 or to each semiconductor die 40 either before or after mounting to pads 22. In any event, heat spreader 80 is electrically isolated from semiconductor die 40 by electrically insulating material 98.

As shown in FIG. 5C, semiconductor die 40, wire bonds 34, 35, 37, as well as wire bonds 36, 39 (not shown), are covered with mold compound 70, such as by transfer molding the assembly of leadframe strip 320 and heat spreader strip 380 in a common mold. For each leadframe 20, mold compound 70 partially covers pad 22 and heat spreader 80, leaving part of pad 22 opposite semiconductor die 40 exposed on an outer surface 12 (FIG. 1A) of semiconductor package 10 and leaving part of heat spreader 80 opposite semiconductor die 40 exposed on an outer surface 14 (FIG. 1A) of semiconductor package 10 (FIG. 6, step 410).

Figure 5D:
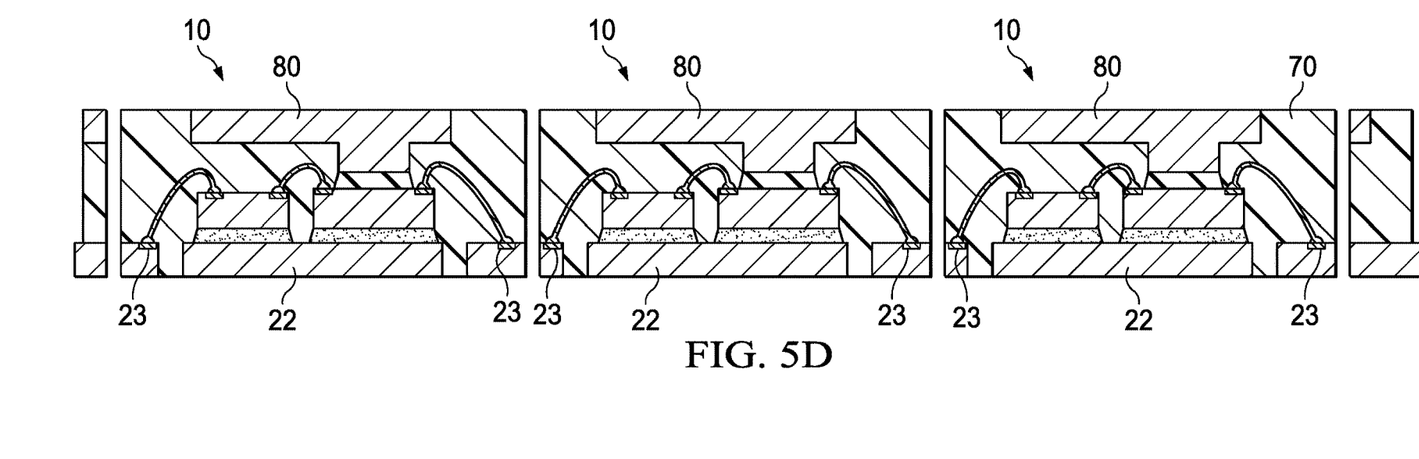

As shown in FIG. 5D, following molding of mold compound 70, the discrete packages 10 are singulated from an array of interconnected packages of the common mold (FIG. 6, step 412). For example, singulation may include cutting through mold compound 70 within spaces separating the semiconductor dies of each package each other, and removing tie bars 324, 84 and siderails 328, 388 of leadframe strip 320 and heat spreader strip 380 with a saw or other cutting implement.

Following singulation to form discrete packages 10, leads 23 are located along the perimeter of the resulting discrete packages 10. In this manner, packages 10 represent flat no-leads packages, and more specifically, quad-flat no-leads (QFN) with leads 23 on each of the four sides of the package. These and other surface mount technologies serve to connect electronic assemblies, such as integrated circuits, to printed circuit boards without through-holes. While the particular packages described herein represent QFN packages, the disclosed techniques may be applied to any transfer molding process with a substrate including a siderail, such as dual-flat no-leads (DFN).

The method may further include mounting a discrete semiconductor package 10 on a PCB 202 (FIG. 3) to electrically connect the leads 23 to a set of electrical contacts 203 on a first side of the PCB 202 and thermally couple pad 22 to thermal vias 204 located adjacent electrical contacts 203. Thermal vias 204 extend through a thickness of the PCB 202 to a second side of the PCB 202. The method may further include mounting a heatsink 212 adjacent and thermally coupled to heat spreader 80 on the first side of PCB 202 and mounting a heatsink 214 adjacent and thermally coupled to the thermal vias 204 on the second side of PCB 202. (FIG. 6, step 414).

Figure 7:
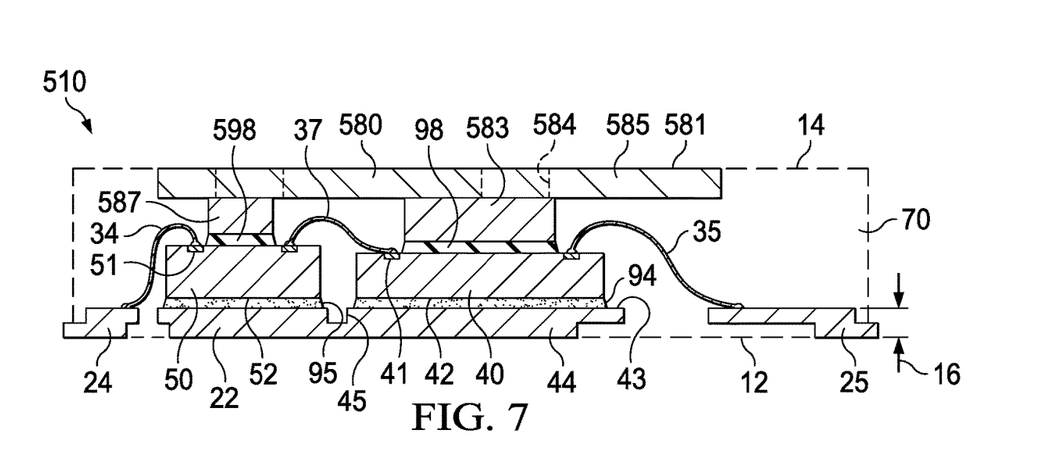
FIG. 7 is a cross section side view of a semiconductor package similar to the semiconductor package of FIGS. 1A-1E, with the addition of a second heat spreader protrusion that facilitates conductive cooling from a second semiconductor die of the package.

FIG. 7 is a cross section side view of a semiconductor package 510. Semiconductor package 510 is similar to semiconductor package 10 except that heat spreader 80 has been replaced by heat spreader 580 and electrically insulating material 598 is added adjacent to the active side of control die 50. For brevity, many details of described with respect to semiconductor package 10 are not repeated with respect to semiconductor package 510.

Like semiconductor package 10, semiconductor package 510 includes semiconductor dies 40, 50 mounted side-by-side on leadframe pad 22. Wire bonds connect semiconductor dies 40, 50 and leads 23. Heat spreader 580 is substantially similar to heat spreader 80 with the addition of a second heat spreader protrusion 587 that facilitates conductive cooling from a control die 50.

Exposed pad 585 of heat spreader 580 opposite semiconductor die 40 is exposed on outer surface 14 of semiconductor package 10. Exposed pad 585 with exposed surface 581 is over wire bonds 35, 37, 39 as viewed from a direction perpendicular to a planar surface of pad 22. Exposed pad 585 with exposed surface 581 is also over a portion of control die 50 and wire bonds 34, 36.

Heat spreader 580 forms a planar exposed pad 585 with exposed surface 581, and tie bars 584. Tie bars 584 remain from assembly techniques using a heat spreader strip with an array of interconnected heat spreaders as shown with respect to FIGS. 4A and 4B. Heat spreader 580 further forms protrusions 583, 587 extending from the underside of exposed pad 585. Protrusion 583 is sized to be adjacent the active side of semiconductor die 40 inside a perimeter of the bond pads and associated wire bonds of semiconductor die 40. Similarly, protrusion 587 is sized to be adjacent the active side of control die 50 inside a perimeter of the bond pads and associated wire bonds of control die 50.

Protrusion 583 of heat spreader 80 is adjacent to electrically insulating material 98 and thermally coupled to semiconductor die 40 via electrically insulating material 98. In various examples, electrically insulating material 98 may include mold compound 70, a non-conductive thermal interface material, and/or a ceramic shim. Likewise, protrusion 587 of heat spreader 80 is adjacent to electrically insulating material 598 and thermally coupled to control die 50 via electrically insulating material 598. In various examples, electrically insulating material 598 may include mold compound 70, a non-conductive thermal interface material, and/or a ceramic shim.

Like heat spreader 80, heat spreader 580 may be a metallic heat spreader formed from a metal, such as copper or a copper alloy. Heat spreader 580 is electrically isolated from the electronic components of package 510 by electrically insulating material 98 adjacent to the active side of semiconductor die 40, and electrically insulating material 598 adjacent to the active side of control die 50.

While in the forgoing description of semiconductor package 510 includes semiconductor die 40 with a high-side power stage and a low-side control die 50, in other examples, the techniques may be applied to packages including more than one power stage, such as a half bridge packages. In such examples, the heat created by each semiconductor die including a power stage may be dissipated via heat spreader protrusions, as with semiconductor dies 40, 50 of semiconductor package 510.

The specific techniques for semiconductor packages including heat spreaders, such as semiconductor package 10 and semiconductor package 510, are merely illustrative of the general inventive concepts included in this disclosure as defined by the following claims. As an example, this disclosure applies not only to active semiconductor devices with power stages, but also to semiconductor packages with any combination of active and passive components.

What is claimed is:
1. A semiconductor package comprising:
a metallic pad and leads;
a semiconductor die attached to the metallic pad, the semiconductor die including an active side with bond pads opposite the metallic pad;
a wire bond extending from a respective bond pad of the semiconductor die to a respective lead of the leads;
a heat spreader over the active side of the semiconductor die with a gap separating the active side of the semiconductor die from the heat spreader;
an electrically insulating material within the gap and in contact with the active side of the semiconductor die and the heat spreader; and
mold compound covering the semiconductor die and the wire bond, and partially covering the metallic pad and the heat spreader, with the metallic pad exposed on a first outer surface of the semiconductor package and with the heat spreader exposed on a second outer surface of the semiconductor package, wherein a top surface of the heat spreader and a top surface of the mold compound are coplanar at the second outer surface.

2. The semiconductor package of claim 1, wherein the electrically insulating material is selected from a group consisting of:

the mold compound;
a thermal interface material; and
a ceramic shim.

3. The semiconductor package of claim 1, wherein a thermal contact area between the electrically insulating material and the active side of the semiconductor die is smaller than an exposed surface of the heat spreader on the second outer surface of the semiconductor package.

4. The semiconductor package of claim 3, wherein the exposed surface of the heat spreader is over the wire bond as viewed from a direction perpendicular to a planar surface of the metallic pad.

5. The semiconductor package of claim 1, wherein the heat spreader is electrically isolated from the semiconductor die and the bond pads.

6. The semiconductor package of claim 1, further comprising a thermal interface material attaching the semiconductor die to the metallic pad.

7. The semiconductor package of claim 1, wherein the heat spreader is a metallic heat spreader.

8. The semiconductor package of claim 1, wherein the package is a Quad Flat No-Lead (QFN) package.

9. A semiconductor package comprising:
a metallic pad and leads;
a first semiconductor die attached to the metallic pad, the first semiconductor die including an active side with bond pads opposite the metallic pad;
a first wire bond extending from a respective bond pad of the first semiconductor die to a respective lead of the leads;
a second semiconductor die adjacent to the first semiconductor die on the pad;
a second wire bond connecting a second bond pad of the first semiconductor die to a bond pad of the second semiconductor die;
a heat spreader over the active side of the first semiconductor die with a gap separating the active side of the first semiconductor die from the heat spreader;
an electrically insulating material within the gap and in contact with the active side of the first semiconductor die and the heat spreader; and
mold compound covering the first semiconductor die, the first wire bond, the second semiconductor die, and the second wire bond, and partially covering the metallic pad and the heat spreader, with the metallic pad exposed on a first outer surface of the semiconductor package and with the heat spreader exposed on a second outer surface of the semiconductor package.

10. The semiconductor package of claim 9,
wherein an exposed surface of the heat spreader is over the first wire bond and the second wire bond as viewed from a direction perpendicular to a planar surface of the metallic pad.

11. The semiconductor package of claim 9,
wherein the first semiconductor die includes a power stage, and
wherein the second bond pad of the first semiconductor die is a control input for the power stage.

12. The semiconductor package of claim 11, wherein the power stage includes at least one a group consisting of:
a field effect transistor (FET);
a junction FET (JFET);
a metal-oxide-semiconductor field-effect transistor (MOSFET);
a metal-semiconductor field-effect transistor (MESFET);
an insulated-gate bipolar transistor (IGBT);
a bipolar junction transistor (BJT);
a thyristor;
an integrated gate commutated thyristor (IGCT);
a silicon controlled rectified (SCR);
a triode for alternating current (TRIAC);
a high electron mobility transistor (HEMT); and
a uni junction transistor (UJT).

13. The semiconductor package of claim 11, wherein a voltage rating of the power stage is at least 80 volts.

14. A semiconductor package comprising:
a metallic pad and leads;
a first semiconductor die attached to the metallic pad, the first semiconductor die including an active side with bond pads opposite the metallic pad;
a first wire bond extending from a respective bond pad of the first semiconductor die to a respective lead of the leads;
a second semiconductor die attached to the metallic pad and adjacent to the first semiconductor die;
a second wire bond connecting a second bond pad of the first semiconductor die to a bond pad of the second semiconductor die;
a heat spreader over the active side of the first semiconductor die with a gap separating the active side of the first semiconductor die from the heat spreader; and
an electrically insulating material within the gap and in contact with the active side of the first semiconductor die and the heat spreader.

15. The semiconductor package of claim 14 further comprising mold compound covering the first semiconductor die, the first wire bond, the second semiconductor die, and the second wire bond, and partially covering the metallic pad and the heat spreader, with the metallic pad exposed on a first outer surface of the semiconductor package and with the heat spreader exposed on a second outer surface of the semiconductor package.

* * * * *